(12) United States Patent
Suzuki et al.

(10) Patent No.: US 11,038,506 B2
(45) Date of Patent: Jun. 15, 2021

(54) OUTPUT CIRCUIT

(71) Applicant: SOCIONEXT INC., Kanagawa (JP)

(72) Inventors: Toshiya Suzuki, Yokohama (JP); Tomohiko Koto, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/998,330

(22) Filed: Aug. 20, 2020

(65) Prior Publication Data

US 2021/0013881 A1     Jan. 14, 2021

Related U.S. Application Data

(63) Continuation of application No. PCT/JP2018/008257, filed on Mar. 5, 2018.

(51) Int. Cl.
| | |
|---|---|
| *H03K 17/04* | (2006.01) |
| *H03K 17/687* | (2006.01) |
| *G06F 1/04* | (2006.01) |
| *G06F 1/08* | (2006.01) |
| *H03K 5/13* | (2014.01) |
| *H03K 19/0175* | (2006.01) |
| *H03K 5/00* | (2006.01) |

(52) U.S. Cl.
CPC .......... *H03K 17/6872* (2013.01); *H03K 5/13* (2013.01); *H03K 19/0175* (2013.01); *H03K 2005/00019* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,672,990 A | * | 9/1997 | Chaw | H03K 5/1534 327/172 |
| 5,852,379 A | * | 12/1998 | Jiang | H03K 5/133 327/176 |
| 7,015,600 B2 | * | 3/2006 | Adams | H03K 5/06 307/106 |
| 10,355,685 B2 | * | 7/2019 | Iida | H03K 19/017509 |
| 2018/0287600 A1 | | 10/2018 | Iida et al. | |

FOREIGN PATENT DOCUMENTS

| | | |
|---|---|---|
| JP | H09-214306 A | 8/1997 |
| WO | 2017/098909 A1 | 6/2017 |

OTHER PUBLICATIONS

International Search Report issued in International Patent Application No. PCT/JP2018/008257, dated May 22, 2018; with English translation.
Written Opinion issued in International Patent Application No. PCT/JP2018/008257, dated May 22, 2018; with partial English translation.

* cited by examiner

*Primary Examiner* — An T Luu
(74) *Attorney, Agent, or Firm* — McDermott Will and Emery LLP

(57) ABSTRACT

A drive assist circuit includes a pulse generation circuit which outputs a pulse to control an assist operation when an assist signal makes a first transition corresponding to a transition of a gate signal from a high level to a low level. The pulse generation circuit includes a delay circuit provided in one of two inputs of a logic gate. The delay circuit is configured such that a delay is greater when an input makes a transition corresponding to the first transition of the assist signal, as compared to a case where the input makes a transition corresponding to an inverse of the first transition.

9 Claims, 12 Drawing Sheets

IN LOW-SPEED OPERATION

IN HIGH-SPEED OPERATION

OUTPUT CIRCUIT

CROSS-REFERENCE TO RELATED APPLICATIONS

This is a continuation of International Application No. PCT/JP2018/008257 filed on Mar. 5, 2018, the entire disclosure of which is incorporated by reference herein.

BACKGROUND

The present disclosure relates to an output circuit to be used for a semiconductor integrated circuit device.

In a semiconductor integrated circuit device, an interface circuit for inputting and outputting a signal from and to an external device is required to operate at a high speed with low power consumption. In order to achieve high-speed operation as well as low power consumption, a transistor to be used as an I/O transistor operates on a low voltage of, for example, 1.8 V. Meanwhile, the interface circuit needs to be operable to input and output a high voltage signal of, for example, 3.3 V.

WO 2017/098909 discloses an output circuit to be used in a semiconductor integrated circuit device, which circuit has a configuration that achieves high-speed operation without increasing the size of its output transistor. The configuration includes a drive assist circuit, and when the output transistor is in a conductive state to drive an output signal, the gate-source voltage of the output transistor is temporarily increased by an assist operation of the drive assist circuit, thereby improving the driving capability of the output transistor.

SUMMARY

However, investigation by the inventors of the present disclosure found that the configuration of WO 2017/098909 has a possibility of malfunction when the signal frequency is raised and when the speed of circuit operation is increased.

The present disclosure intends to provide to provide an output circuit that can avoid malfunction even when the speed of the circuit operation is increased.

In an aspect of the present disclosure, an output circuit receives a data input signal and outputs an output signal which varies in accordance with the data input signal. The output circuit includes: an output terminal outputting the output signal; a p-type output transistor having a source connected to a first power source providing a first potential and a drain connected to the output terminal; a pre-driver connected to the first power source and a power source end supplied with a potential lower than the first potential, and configured to receive a signal varying in accordance with the data input signal, and to provide a gate signal to a gate of the p-type output transistor, the gate signal transiting between the first potential and the potential supplied to the power source end in accordance with the received signal; and a drive assist circuit connected to a second power source providing a second potential lower than the first potential, and configured to supply the second potential from an output node to the power source end, the drive assist circuit being configured to receive, as an assist signal, the data input signal or a signal varying in accordance with the data input signal, and being configured to perform an assist operation of temporarily bringing down a potential at the output node from the second potential when the assist signal makes a first transition corresponding to the transition of the gate signal from a high level to a low level. Further, the drive assist circuit further includes: a pulse generation circuit configured to receive the assist signal, and configured to output a pulse that controls the assist operation when the assist signal makes the first transition. The pulse generation circuit includes a logic gate having at least two inputs and configured to output the pulse, a delay circuit provided to one of two paths configured to transmit the assist signal to the two inputs of the logic gate, respectively, and an inverter provided to one of the two paths, the delay circuit being configured such that a delay is greater when an input to the delay circuit makes a transition corresponding to the first transition of the assist signal, as compared to a delay when an input to the delay circuit makes a transition corresponding to an inverse of the first transition of the assist signal.

Hence, in the output circuit, when the gate signal transits from the high level to the low level, and the output transistor goes to the conductive state to drive the output signal, the assist operation of the drive assist circuit can temporarily raise the gate-source voltage of the output transistor. The temporal rise in the gate-source voltage can enhance the driving capability of the output transistor, contributing to an increase in transition speed of the output signal from the low level to the high level. Such features can achieve a high-speed operation of the output circuit without increasing the size of the output transistor.

Further, the delay circuit is configured such that a delay is greater when the transition an input makes corresponds to the first transition of the assist signal, as compared to a case where the transition corresponds to an inverse of the first transition of the assist signal. Then, when the frequency of the data input signal increases and the output circuit operates at a high speed, the time period between the first transition of the assist signal and the transition inverse of the first transition is shortened. In this case, before the input to the delay circuit makes the transition corresponding to the first transition of the assist signal and before the output from the delay circuit makes a transition, the input to the delay circuit makes a transition corresponding to an inverse of the first transition of the assist signal, thus causing a transition of the output from the delay circuit. That is, the output from the delay circuit does not make a transition and the logic level remains constant in the high level. Therefore, a pulse corresponding to the assist signal is output from the logic gate, and the assist operation can be reliably performed at the timing of the first transition of the assist signal.

According to the present disclosure, it is possible to provide an output circuit capable of avoiding malfunction even in the case where the circuit operation is accelerated.

DETAILED DESCRIPTION

Embodiments will be described in detail with reference to the drawings. Note that the circuit diagrams below are simplified, mainly illustrating constituent elements of the present disclosure. Hence, illustrated constituent elements seemingly make a direct connection with each other. In an actual circuit configuration, however, these elements may be connected indirectly with each other because there may be another constituent element provided between the elements.

First Embodiment

Figure 1:
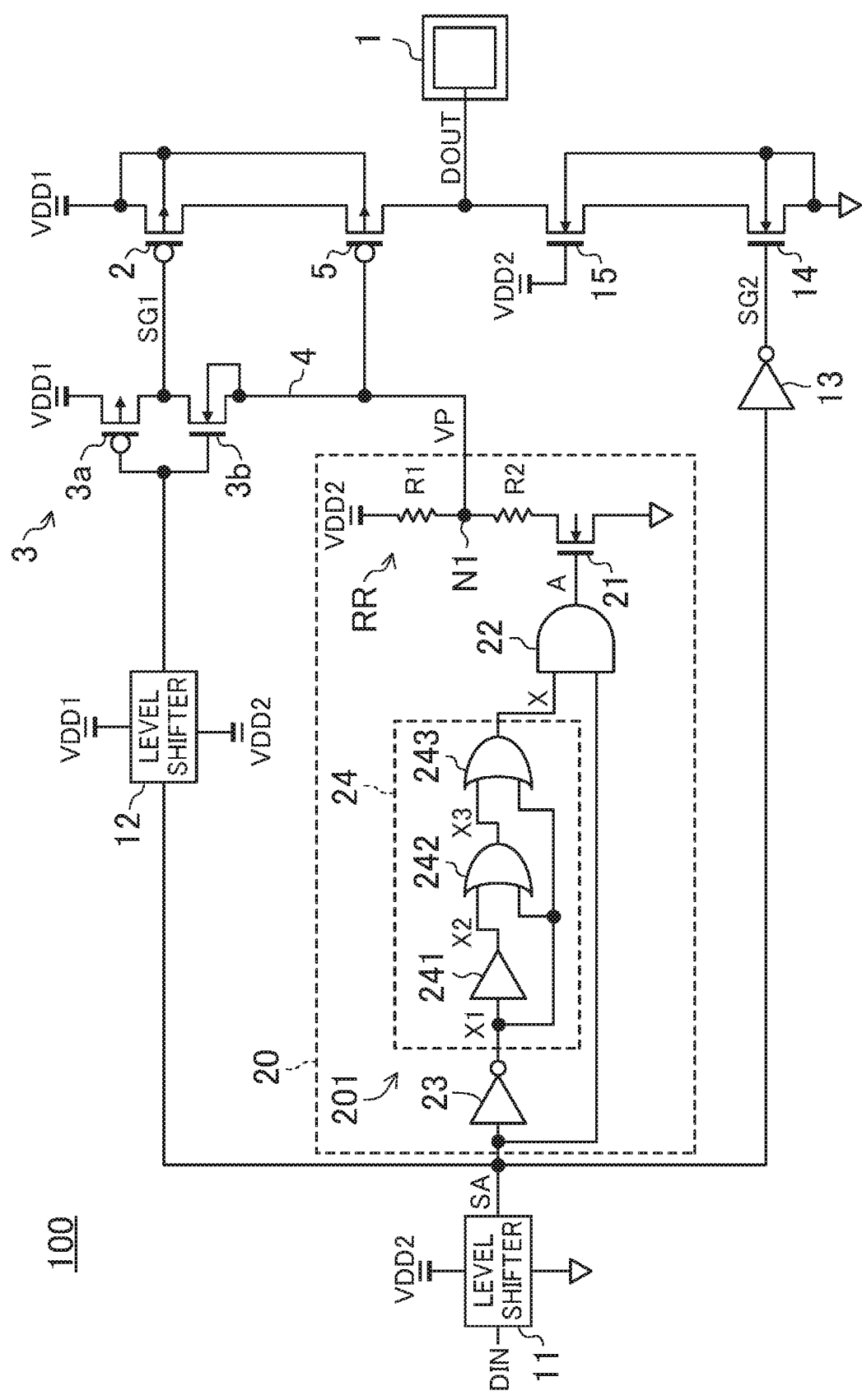
FIG. 1 is a circuit diagram of an output circuit according to a first embodiment.

FIG. 1 is a circuit diagram of an output circuit according to a first embodiment. The output circuit 100 in FIG. 1 receives the data input signal DIN and outputs an output signal DOUT that changes in accordance with the data input signal DIN. The output signal DOUT is output from an output terminal 1. This output circuit 100 is provided, for example, in a signal output unit of a large-scale integrated circuit (LSI). In this case, an output pad of the LSI corresponds to the output terminal 1.

The output circuit 100 is connected to a first power source VDD1 and a second power source VDD2. Note that, in the specification of the present application, the reference signs "VDD1" and "VDD2" denote both the power sources themselves and the potentials provided from the power sources. The first potential VDD1 is, for example, 3.3 V, and the second potential VDD2 is lower than the first potential VDD1 to be, for example, 1.8 V. The data input signal DIN has a low amplitude, and transits between a ground potential GND and a potential of 0.9 V, for example. The output signal DOUT transits between the ground potential GND and the first potential VDD1.

The output circuit 100 includes level shifters 11 and 12, inverters 3 and 13, p-type transistors 2 and 5, and n-type transistors 14 and 15. Each of the transistors is a metal oxide semiconductor field effect transistor (MOSFET). The level shifter 11 receives the data input signal DIN having a low amplitude, converts the data input signal DIN into a signal SA to transit between the ground potential GND and the second potential VDD2, and outputs the signal SA. The level shifter 12 converts the signal SA into a signal to transit between the second potential VDD2 and the first potential VDD1, and provides the signal to the inverter 3.

The inverter 3 includes a p-type transistor 3a and an n-type transistor 3b, and is connected to the first power source VDD1 and a power source end 4 supplied with a potential VP lower than the first potential VDD1. The p-type transistor 3a has a gate and a drain respectively connected to a gate and a drain of the n-type transistor 3b. The inverter 3 as an example of a pre-driver inverts the signal from the level shifter 12, and provides the inverted signal as a gate signal SG1 to a gate of the p-type transistor 2. The gate signal SG transits between the first potential VDD1 and the potential VP at the power source end 4. Note that, usually, the second potential VDD2 is supplied as the potential VP.

The p-type transistor 2 as an output transistor has a source connected to the first power source VDD1 and a drain connected to the output terminal 1 via the p-type transistor 5. Specifically, the p-type transistors 2 and 5 are connected in a cascade to the output terminal 1. When the gate signal SG1 transits from the high level (VDD1) to the low level (VP), the p-type transistor 2 changes from a non-conductive state to a conductive state. Hence, the potential of the output signal DOUT is brought high toward the first potential VDD1, and the output signal DOUT transits to the high level (VDD1).

The inverter 13 inverts the signal SA, and provides the inverted signal as a gate signal SG2 to a gate of the n-type transistor 14. The n-type transistor 14 has a source grounded and a drain connected to the output terminal 1 via the n-type transistor 15. When the gate signal SG2 transits from the low level (GND) to the high level (VDD2), the n-type transistor 14 changes from a non-conductive state to a conductive state. Hence, the potential of the output signal DOUT is brought low toward the ground potential GND, and the output signal DOUT transits to the low level (GND).

The output circuit 100 further includes a drive assist circuit 20. The drive assist circuit 20 is connected to the second power source VDD2, and supplies the potential VP from an output node N1. The output node N1 is connected to the power source end 4, and is also connected to a gate of the p-type transistor 5. When not performing an assist operation, which will be described later, the drive assist circuit 20 outputs the second potential VDD2 as the potential VP from the output node N1. Here, since the second potential VDD2 is supplied from the drive assist circuit 20 to the power source end 4, the gate signal SG1 to be output from the inverter 3 transits between the first potential VDD1 and the second potential VDD2. When the signal SA as an assist signal transits from the low level to the high level, the drive assist circuit 20 performs the assist operation in which the potential VP at the output node N1 is temporarily brought down from the second potential VDD2. Here, the transition of the signal SA from the low level to the high level corresponds to the transition of the gate signal SG1 to be output from the inverter 3, from the high level to the low level.

The drive assist circuit 20 specifically includes: an n-type transistor 21 having a source grounded; an AND gate 22; an inverter 23 receiving the signal SA; a delay circuit 24 receiving an output signal from the inverter 23; and a resistor string RR having resistors R1 and R2 connected in series between the second power source VDD2 and the drain of the n-type transistor 21. A connection node between the resistors R1 and R2 is the output node N1 of the drive assist circuit 20. The AND gate 22 receives, as inputs, the signal SA and an output from the delay circuit 24, and provides an output A to the gate of the n-type transistor 21. After the signal SA transits from the low level to the high level, the output A is brought to the high level for a predetermined time period. Specifically, the AND gate 22 as an example of a logic gate, the inverter 23, and the delay circuit 24 constitute a pulse generation circuit 201. When the signal SA transits from the low level to the high level, the pulse generation circuit 201 outputs a pulse having a predetermined pulse width. When the output A is at the low level, the n-type transistor 21 is in a non-conductive state. In this state, the potential VP of the output node N1 is the second potential VDD2. Meanwhile, when the output A is at the high level, the n-type transistor 21 is in a conductive state. In this state, the potential VP at the output node N1 is a potential (i.e., referred to as "potential Va" in this state) obtained when the second potential VDD2 is divided by a resistance ratio of the resistor R1 to the resistor R2. The n-type transistor 21 is an example of a switching element that is in the conductive state when the pulse generation circuit 201 outputs the pulse and is in the non-conductive state when the pulse generation circuit 201 does not output the pulse.

The delay circuit 24 includes a buffer 241 and OR gates 242 and 243. The buffer 241 receives an output X1 from the inverter 23. The OR gate 242 receives an output X2 from the buffer 241 and an output X1 from the inverter 23. The OR gate 243 receives an output X3 from the OR gate 242 and an output X1 from the inverter 23.

Figure 2:
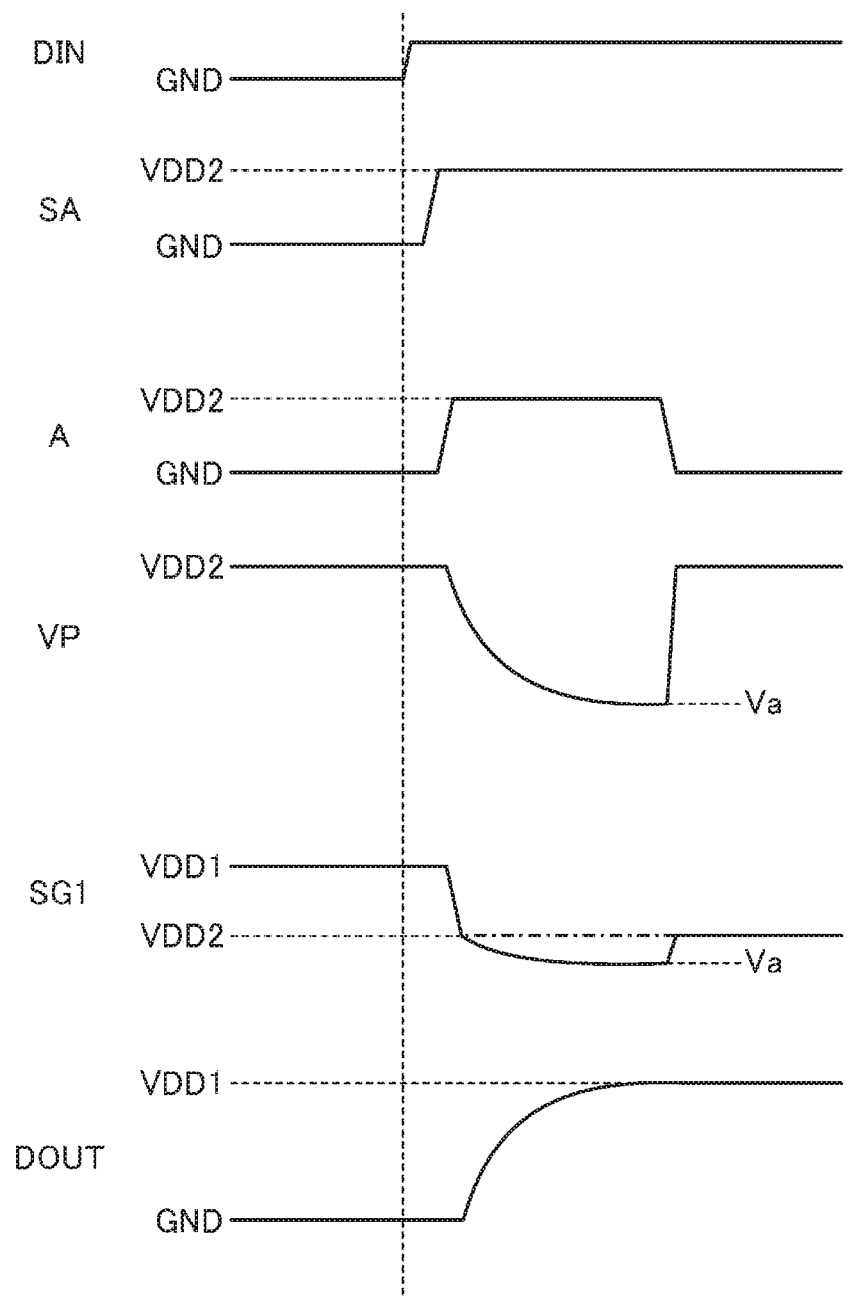
FIG. 2 is a waveform chart illustrating an operation of the output circuit of FIG. 1.

An operation of the circuit in FIG. 1 is described with reference to a waveform chart in FIG. 2. In FIG. 2, for the sake of easy comprehension, a variation of the potential VP alone is illustrated approximately four times as large as variations of other signals and potentials.

When the data input signal DIN is at the low level, the signal SA output from the level shifter 11 is at the low level (GND). In this state, the gate signal SG1 output from the inverter 3 is at the high level (VDD1), and the p-type transistor 2 is in the non-conductive state. Meanwhile, the gate signal SG2 (not shown) output from the inverter 13 is at the high level (VDD2), and the n-type transistor 14 is in the conductive state. As a result, the output signal DOUT is at the low level (GND). In the drive assist circuit 20, the output A is kept at the low level (GND), and the n-type transistor 21 is in the non-conductive state. Hence, the potential VP at the output node N1 is maintained at the second potential VDD2.

When the data input signal DIN transits to the high level, the signal SA output from the level shifter 11 transits to the high level (VDD2). Hence, the gate signal SG1 output from the inverter 3 transits to the low level, and the p-type transistor 2 starts to raise the potential of the output signal DOUT. Note that, in the drive assist circuit 20, the output A is at the high level for a predetermined time period. When the output A is at the high level, the n-type transistor 21 is in the conductive state. Thus, the potential VP at the output node N1 drops from the second potential VDD2 toward the potential Va. Hence, the potential at the power source end 4 drops from the second potential VDD2. As a result, the potential of the gate signal SG1 output from the inverter 3 further drops from the second potential VDD2. When the output A goes back to the low level, the n-type transistor 21 is brought to the non-conductive state. Hence, the potential VP at the output node N1 goes back to the second potential VDD2, and the potential of the gate signal SG1 also goes back to the second potential VDD2.

Specifically, when the data input signal DIN transits from the low level to the high level, the potential of the gate signal SG1 provided to the p-type transistor 2 is further brought down from the second potential VDD2 supplied from an external power source for a predetermined time period. Hence, the gate-source voltage of the p-type transistor 2 can be temporarily raised such that a capability to drive the output signal DOUT with the p-type transistor 2 can be enhanced. The enhanced capability can increase a transition speed of the output signal DOUT from the low level to the high level.

Moreover, the configuration in FIG. 1 makes it possible to address variation of the first potential VDD1 and the second potential VDD2 supplied from an external power source. Specifically, when the first potential VDD1 drops or the second potential VDD2 rises, the gate-source voltage of the p-type transistor 2 drops, causing a decrease in driving capability. In this embodiment, however, the gate-source voltage of the p-type transistor 2 can be sufficiently increased for a predetermined time period since the transition of the gate signal SG1 from the high level to the low level.

Moreover, the circuit configuration of the present embodiment can avoid malfunction even when the speed of the circuit operation is increased. Here, a possible issue rising in a high-speed operation in a conventional circuit configuration will be described with reference to FIG. 3.

Figure 3A:
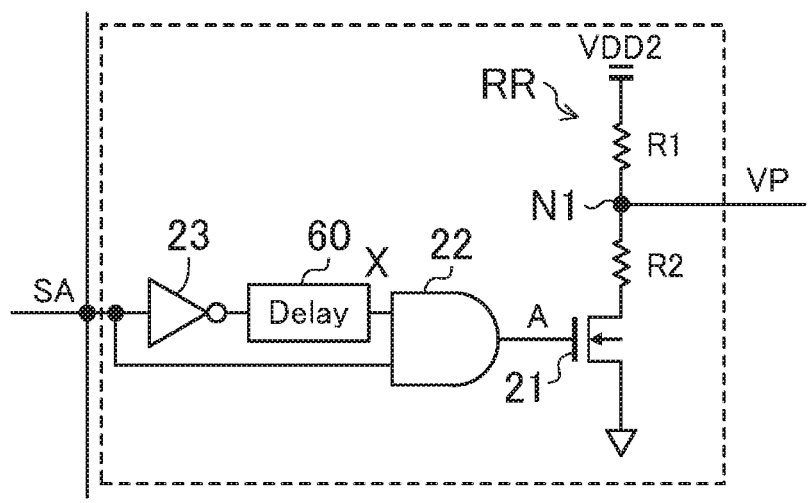
FIG. 3A illustrates an exemplary configuration of a traditional drive assist circuit.
Figure 3B:
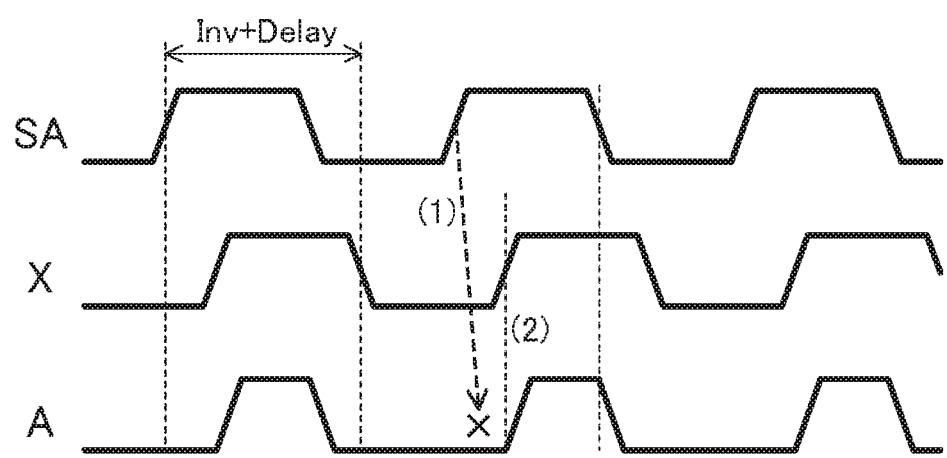
FIG. 3B is a waveform chart illustrating an exemplary operation at a high speed.

FIG. 3A illustrates the configuration of a conventional drive assist circuit. The operation of this drive assist circuit is similar to the operation of the drive assist circuit 20 already described above. However, a phenomenon as illustrated in FIG. 3B occurs when the frequency of the data input signal DIN increases, and the speed of the circuit operation increases. In the figure, the reference Inv denotes a delay time in the inverter 23, and the Delay denotes a delay time in the delay circuit 60.

The output X from the delay circuit 60 falls when a delay time (Inv+Delay) elapses from a rising edge of the signal SA, and rises when the delay time (Inv+Delay) elapses from a falling edge of the signal SA. The AND gate 22 outputs, as an output A, a logical product signal of the signal SA and the output X from the delay circuit 60. Here, as illustrated in FIG. 3B, it is supposed that the frequency of the data input signal DIN increases and the transition period of the signal SA (from the rising edge to the falling edge) is shortened to become shorter than the delay time (Inv+Delay). In this case, the output X of the delay circuit 60 does not yet rise at the rising edge of the signal SA. Therefore, the output A from the AND gate 22 does not rise at the rising timing of the signal SA (1). The output A from the AND gate 22 rises eventually at the rising timing of the output X from the delay circuit 60 (2). Therefore, there arises a problem that the assist operation for lowering the potential VP cannot start at the rising timing of the signal SA. This may lead to a possibility of malfunction of the circuit and is not preferable.

The present embodiment, on the other hand, improved the configuration of the delay circuit 24 in the pulse generation circuit 201 so that the above malfunction does not occur even when the speed of the circuit operation is increased. This is described below with reference to FIG. 4.

Figure 4A:
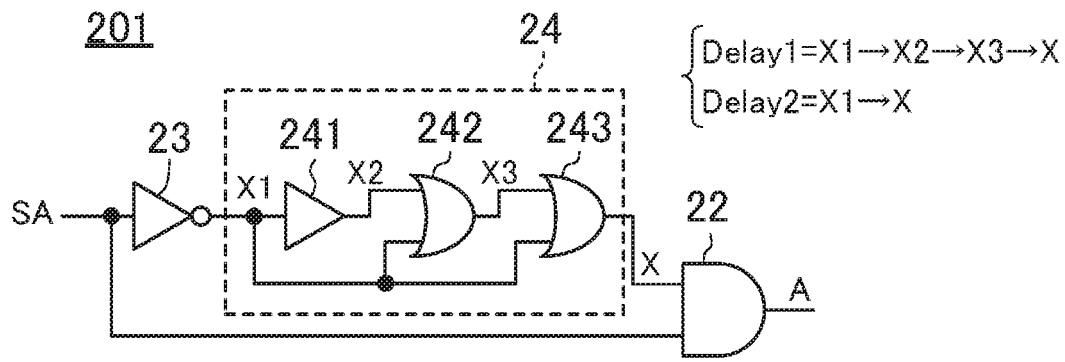
FIG. 4A illustrates an exemplary configuration of a pulse generation circuit in a drive assist circuit according to the embodiment.

FIG. 4A illustrates an exemplary configuration of the pulse generation circuit 201 in the drive assist circuit 20 according to the present embodiment. In the delay circuit 24, a fall of an input X1 is transmitted sequentially via the buffer 241, the OR gate 242, and the OR gate 243 in this order, and the output X falls thereafter (X1→X2→X3→X). The delay time in this case is assumed to be Delay 1. On the other hand, a rise of the input X1 is transmitted via the OR gate 243, and the output X rises thereafter (X1→X). The delay time in this case is assumed to be Delay 2. Here, Delay 1>Delay 2 is satisfied. That is, in the delay circuit 24, there are different signal transmission paths for rising and falling of the input signal X1, respectively, and the transmission delay for rising is shorter than the transmission delay for falling.

Figure 4B:
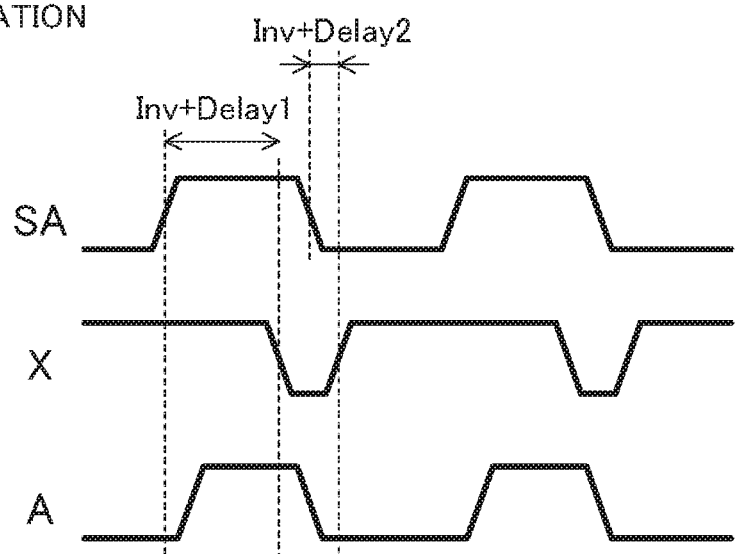
FIG. 4B is a waveform chart illustrating an exemplary operation at a low speed.

FIG. 4B illustrates an exemplary low-speed operation. As shown in FIG. 4B, when the signal SA rises, the output X from the delay circuit 24 falls after the delay time of (Inv+Delay 1). Meanwhile, when the signal SA falls, the output X from the delay circuit 24 rises after the delay time of (Inv+Delay 2). The output A from the AND gate 22 therefore rises at the rising timing of the signal SA, and the assist operation to bring down the potential VP starts at this rising timing of the signal SA. The output A from the AND gate 22 falls in accordance with the fall of the output X.

Figure 4C:
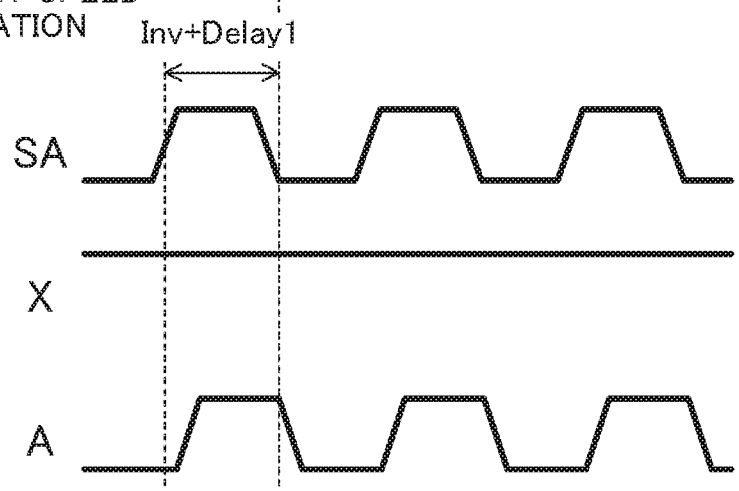
FIG. 4C is a waveform chart illustrating an exemplary operation at a high speed.

FIG. 4C illustrates an exemplary high-speed operation. Here, it is supposed that the frequency of the data input signal DIN increases and the transition period of the signal SA (from the rising edge to the falling edge) becomes shorter than the delay time (Inv+Delay 1). In this case, after the signal SA rises, the signal SA falls before the delay time (Inv+Delay1) elapses and the output X falls. After the fall of the signal SA, the output X is maintained at the high level even after the elapse of the delay time (Inv+Delay 2). The output X from the delay circuit 24 therefore stays at the high level without falling. Thus, the output A from the AND gate 22 becomes a signal that rises in accordance with the rise of the signal SA and falls in accordance with the fall of the signal SA. And the assist operation to bring down the potential VP starts at the rising timing of the signal SA. Note that the high-level period of the output A from the AND gate 22 is the same as the high-level period of the signal SA.

With the configuration of the pulse generation circuit 201 as illustrated in FIG. 4A, the assist operation to bring down the potential VP is reliably performed at the rising timing of the signal SA, whether the circuit operation is at a low speed or a high speed.

In the output circuit 100 of this embodiment, when the assist signal SA makes a first transition corresponding to the transition of the gate signal SG1 from the high level to the low level, the drive assist circuit 20 performs the assist operation in which the potential VP of the output node N1 is temporarily brought down from the second potential VDD2. Hence, when the gate signal SG1 transits from the high level to the low level, and the p-type transistor 2 goes to the conductive state to drive the output signal DOUT, the assist operation of the drive assist circuit 20 can temporarily raise the gate-source voltage of the p-type transistor 2. The temporal increase in the gate-source voltage can enhance the driving capability of the p-type transistor 2, contributing to an increase in transition speed of the output signal DOUT from the low level to the high level. Such features can achieve a high-speed operation of the output circuit 100 without increasing the size of the p-type transistor 2.

Further, the period from the rise to the fall of the assist signal SA is shortened when the frequency of the data input signal DIN increases and the output circuit operates at a high speed. In such a case, however, after the input X1 from the delay circuit 24 falls, the input X1 from the delay circuit 24 rises before the output X falls. This maintains the rising state of the output X. That is, the output X from the delay circuit 24 does not make a transition and remains constant at the high level. Therefore, the AND gate 22 outputs a pulse corresponding to the assist signal SA, and the assist operation can be reliably performed at the rising timing of the assist signal SA.

Note that, in the configuration in FIG. 1, the resistor string RR includes, but not limited to, the two resistors R1 and R2. For example, multiple resistors connected in series may constitute the resistor string RR, and any given connection node between the resistors themselves may be designated as the output node N1. A resistor included in the resistor string RR may be implemented, for example, in a combination of multiple resistor elements. Alternatively, the resistor may be implemented, using a transistor resistor.

Furthermore, in the configuration in FIG. 1, the level shifter 12 is to receive the first potential VDD1 and the second potential VDD2. Alternatively, the level shifter 12 may receive the potential VP supplied to the power source end 4, instead of the second potential VDD2.

The configuration of the delay circuit 24 is solely an example, and any configuration may be adoptable provided that such a configuration makes a transmission delay of the rising of the input X1 smaller than the transmission delay of the fall of the input X1. Moreover, the configuration of the delay circuit 24 allows adjustment of the amount of delay, by increasing or decreasing the number of stages of the OR gates.

Second Embodiment

Figure 5:
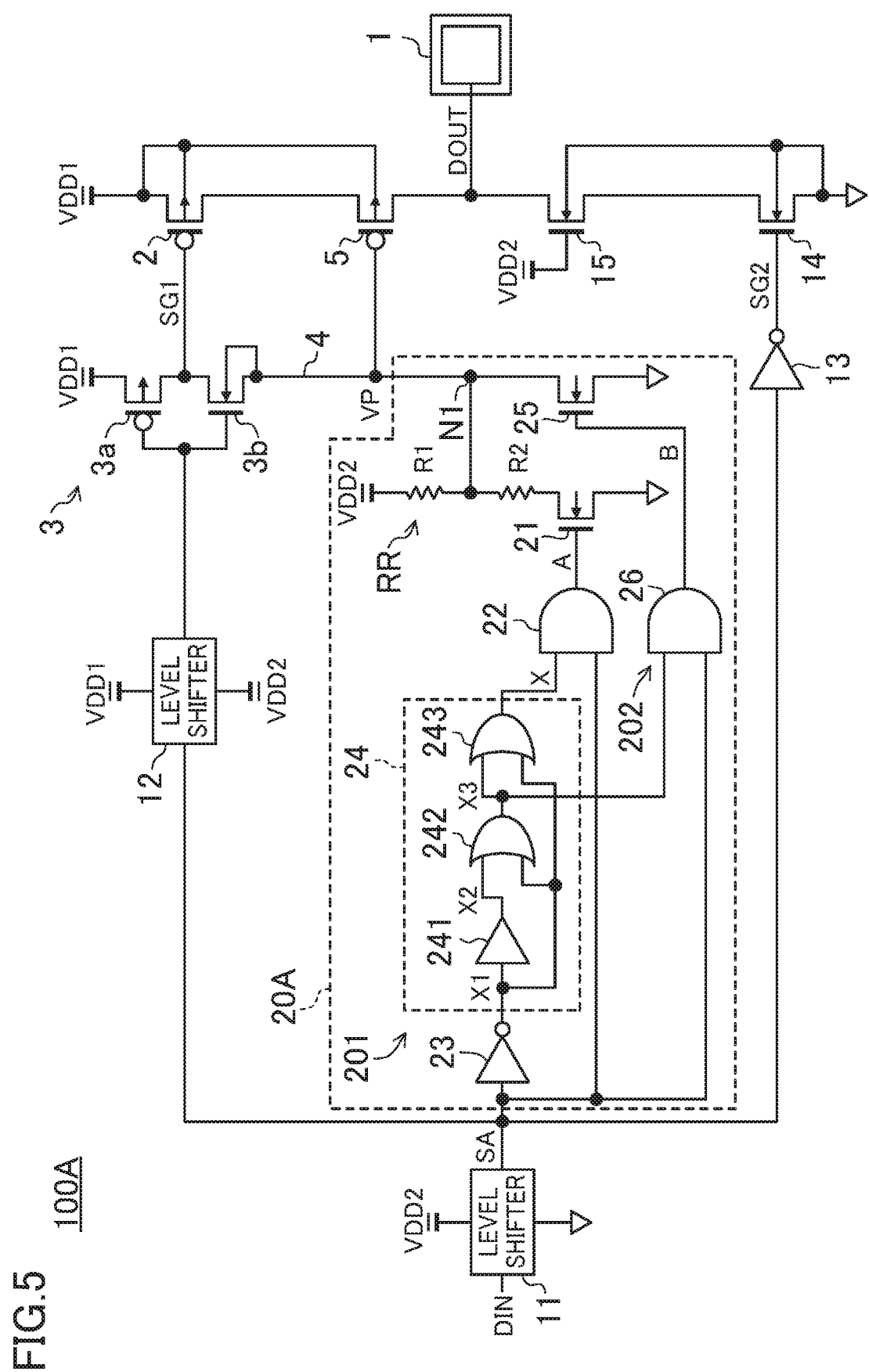
FIG. 5 is a circuit diagram of an output circuit according to a second embodiment.

FIG. 5 is a circuit diagram of an output circuit according to a second embodiment. An output circuit 100A in FIG. 5 has a configuration similar to that of the output circuit 100 in FIG. 1. Detailed explanations of the previously described features may be omitted.

The output circuit 100A in FIG. 5 is different in internal configuration of the drive assist circuit 20A from the output circuit 100 in FIG. 1. The drive assist circuit 20A includes: an n-type transistor 21 having a source grounded; an AND gate 22; an inverter 23 receiving the signal SA; a delay circuit 24 receiving an output signal from the inverter 23; and a resistor string RR having resistors R1 and R2 connected in series between the second power source VDD2 and the drain of the n-type transistor 21. The output node N1 of the drive assist circuit 20A is connected to the connection node between the resistors R1 and R2. The AND gate 22 receives, as inputs, the signal SA and an output from the delay circuit 24, and provides an output A to the gate of the n-type transistor 21. The drive assist circuit 20A further includes an n-type transistor 25 and an AND gate 26. The n-type transistor 25 has a source grounded and a drain connected to the output node N1. The AND gate 26 receives, as inputs, the signal SA and an output from an OR gate 242 in the delay circuit 24, and provides an output B to the gate of the n-type transistor 25.

Specifically, the AND gate 22, the inverter 23, and the delay circuit 24 constitute a pulse generation circuit 201. When the signal SA transits from the low level to the high level, the pulse generation circuit 201 outputs a pulse having a predetermined pulse width. Moreover, the AND gate 26, the inverter 23, and the delay circuit 24 constitute a second pulse generation circuit 202. When the signal SA transits from the low level to the high level, the second pulse generation circuit 202 outputs a second pulse. The second pulse output from the second pulse generation circuit 202 is shorter in pulse width than the pulse output from the pulse generation circuit 201. The n-type transistor 25 is an example of a second switching element that is in a conductive state when the second pulse generation circuit 202 outputs the second pulse and is in the non-conductive state when the second pulse generation circuit 202 does not output the second pulse.

In this embodiment, the drive assist circuit 20A brings down the potential VP at the output node N1 through two paths; namely, a path through the n-type transistor 21 and a path through the n-type transistor 25.

Figure 6:
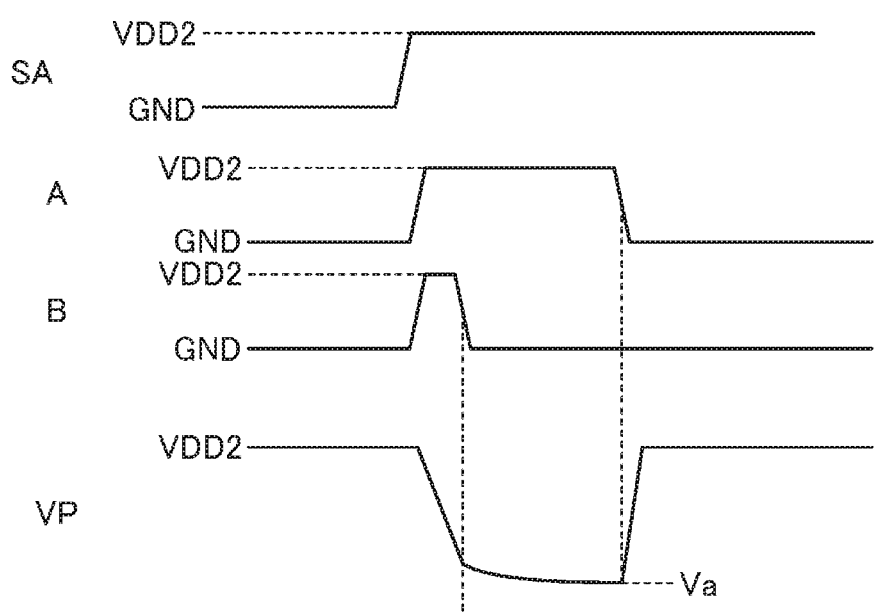
FIG. 6 is a waveform chart illustrating an operation of the output circuit of FIG. 5.

As illustrated in a waveform chart in FIG. 6, after the signal SA transits from the low level to the high level, the output A is brought to the high level for a predetermined time period. Moreover, after the signal SA transits from the low level to the high level, the output B is brought to the high level for a time period shorter than the output A is. Hence, at the beginning of the transition of the signal SA from the low level to the high level, both of the outputs A and B are at the high level. Hence, both of the n-type transistors 21 and 25 are in the conductive state. Hence, the potential VP of the output node N1 is brought down at a high speed. Then, when the output B goes to the low level, the n-type transistor 25 goes to the non-conductive state. Hence, the potential VP at the output node N1 is brought down by the n-type transistor 21 alone. Then, the potential VP becomes the potential Va obtained by dividing the second potential VDD2 by a resistance ratio of the resistor R1 to the resistor R2.

In this embodiment, similar to the first embodiment, when the data input signal DIN transits from the low level to the high level, the potential of the gate signal SG1 that the p-type transistor 2 receives is further brought down from the second potential VDD2 supplied from an external power source for a predetermined time period. Hence, the gate-source voltage of the p-type transistor 2 can be temporarily raised such that a capability to drive the output signal DOUT with the p-type transistor 2 can be enhanced. The enhanced capability can increase a transition speed of the output signal DOUT from the low level to the high level.

Moreover, in this embodiment, the potential VP at the output node N1 can be brought down at a high speed with high precision. In the configuration according to the first embodiment, in order to bring down the potential VP at a high speed, resistivity of the resistors R1 and R2 in the resistor string RR needs to be low. However, in a semiconductor device, lowering resistivity requires a larger element size, causing an increase in the circuit area. In this embodiment, the potential VP can be brought down by the n-type transistor 25 at a high speed, and eventually, the potential Va can be precisely set by the resistor string RR. Hence, the resistors R1 and R2 in the resistor string RR may be left high in resistivity, contributing to curbing an increase in the circuit area.

Moreover, since the drive assist circuit 20A includes the delay circuit 24 having a configuration similar to that in the first embodiment, the assist operation can be reliably performed at the rising timing of the assist signal SA, even when the frequency of the data input signal DIN increases and the output circuit operates at a high speed.

Third Embodiment

Figure 7:
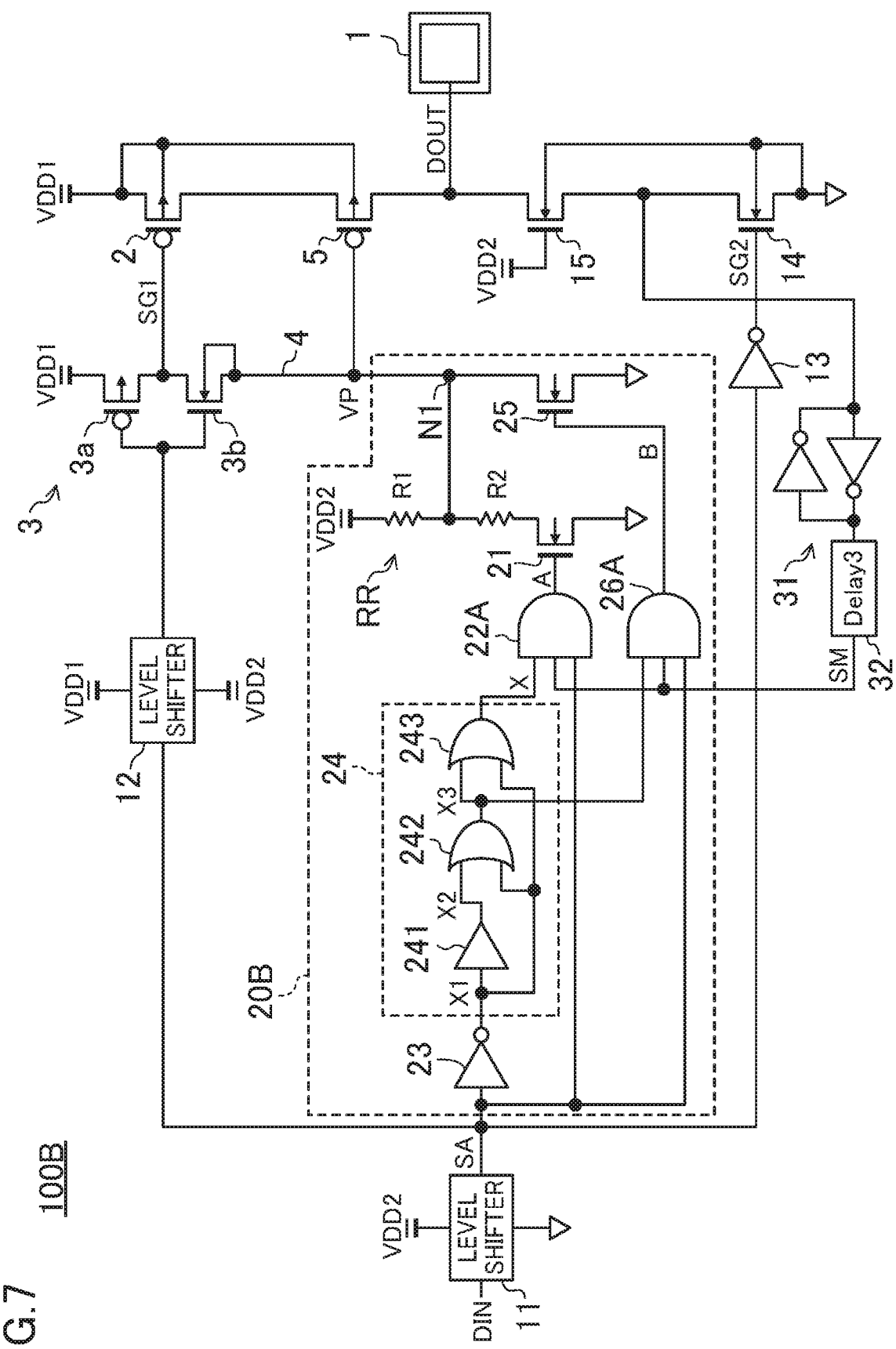
FIG. 7 is a circuit diagram of an output circuit according to a third embodiment.

FIG. 7 is a circuit diagram of an output circuit according to a third embodiment. An output circuit 100B in FIG. 7 has a configuration similar to that of the output circuit 100A in FIG. 5. Detailed explanations of the previously described features may be omitted.

Compared with the output circuit 100A in FIG. 5, the output circuit 100B in FIG. 7 provides a configuration which feeds back a variation of the output signal DOUT to a drive assist circuit 20B. The drive assist circuit 20B has a 3-input AND gate 22A and 26A instead of the AND gates 22 and 26 included in the drive assist circuit 20A in FIG. 3. Then, the output circuit 100B includes: a latch circuit 31 receiving a potential at a connection node between the n-type transistors 14 and 15; and a delay circuit 32 receiving an output of the latch circuit 31. The delay circuit 32 outputs a signal SM. Acting as a monitor signal to detect the variation of the output signal DOUT, the signal SM is provided to the 3-input AND gate 22A and 26A as one input. The latch circuit 31 and the delay circuit 32 constitute a monitor circuit monitoring the variation of the output signal DOUT and outputting the monitor signal SM varying in accordance with the output signal DOUT.

Figure 8:
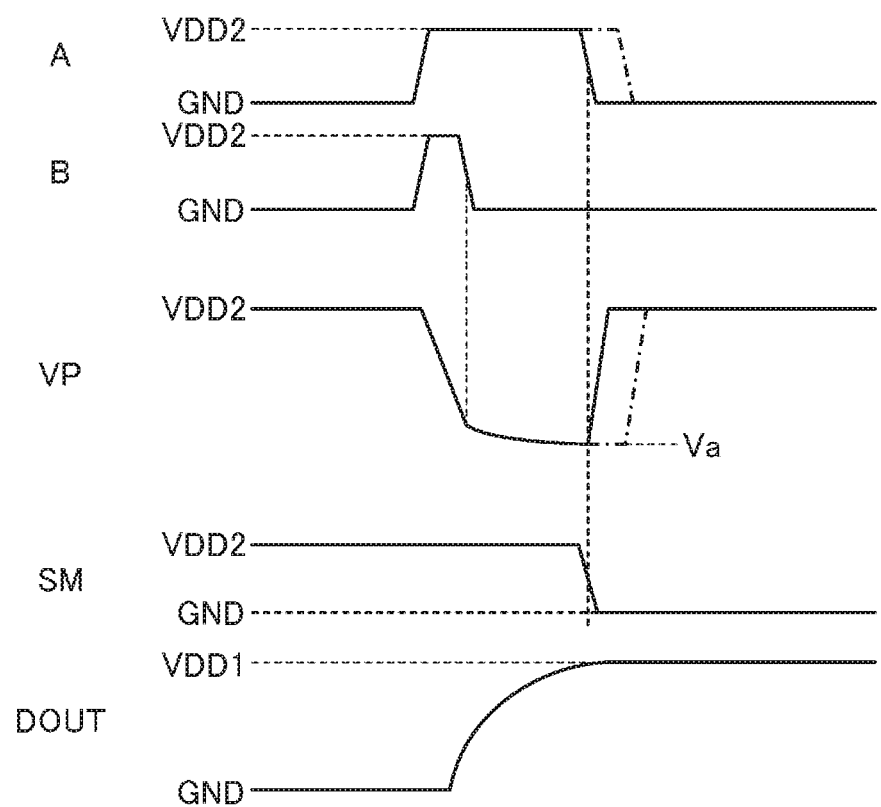
FIG. 8 is a waveform chart illustrating an operation of the output circuit of FIG. 7.

As illustrated in a waveform chart in FIG. 8, when the potential at the connection node between the n-type transistors 14 and 15 rises to a predetermined level while the output signal DOUT transits from the low level to the high level, the signal SM transits from the high level to the low level. Note that timing of the transition is adjusted by the delay circuit 32. This variation of the signal SM indicates that the output signal DOUT has transited from the low level to the high level. As described in the second embodiment, the potential VP at the output node N1 in the drive assist circuit 20B is brought down after the signal SA has transited from the low level to the high level. However, when the signal SM transits from the high level to the low level, outputs A and B from the 3-input AND gate 22A and 26A are forced to be brought down to the low level. The potential VP at the output node N1 is brought back to the second potential VDD2.

That is to say, by feeding back the signal SM to the drive assist circuit 20B, when the output signal DOUT is driven at a high speed, the assist operation performed by the drive assist circuit 20B can be suspended. Such a feature can reduce unnecessary power consumption of the drive assist circuit 20B.

Moreover, since the drive assist circuit 20B includes the delay circuit 24 having the configuration similar to that in the first embodiment, the assist operation can be reliably performed at the rising timing of the assist signal SA, even when the frequency of the data input signal DIN increases and the output circuit operates at a high speed.

Note that, in this embodiment, the variation of the output signal DOUT is detected through, but not limited to, monitoring the potential at the connection node between the n-type transistors 14 and 15. For example, the output signal DOUT may be directly monitored. Alternatively, if the LSI includes a circuit receiving the output signal DOUT, the variation of the output signal DOUT may be monitored at the circuit.

Moreover, as a matter of course, in the first embodiment and other configurations, the variation of the output signal DOUT may be provided as feedback, as disclosed in this embodiment.

Fourth Embodiment

Figure 9:
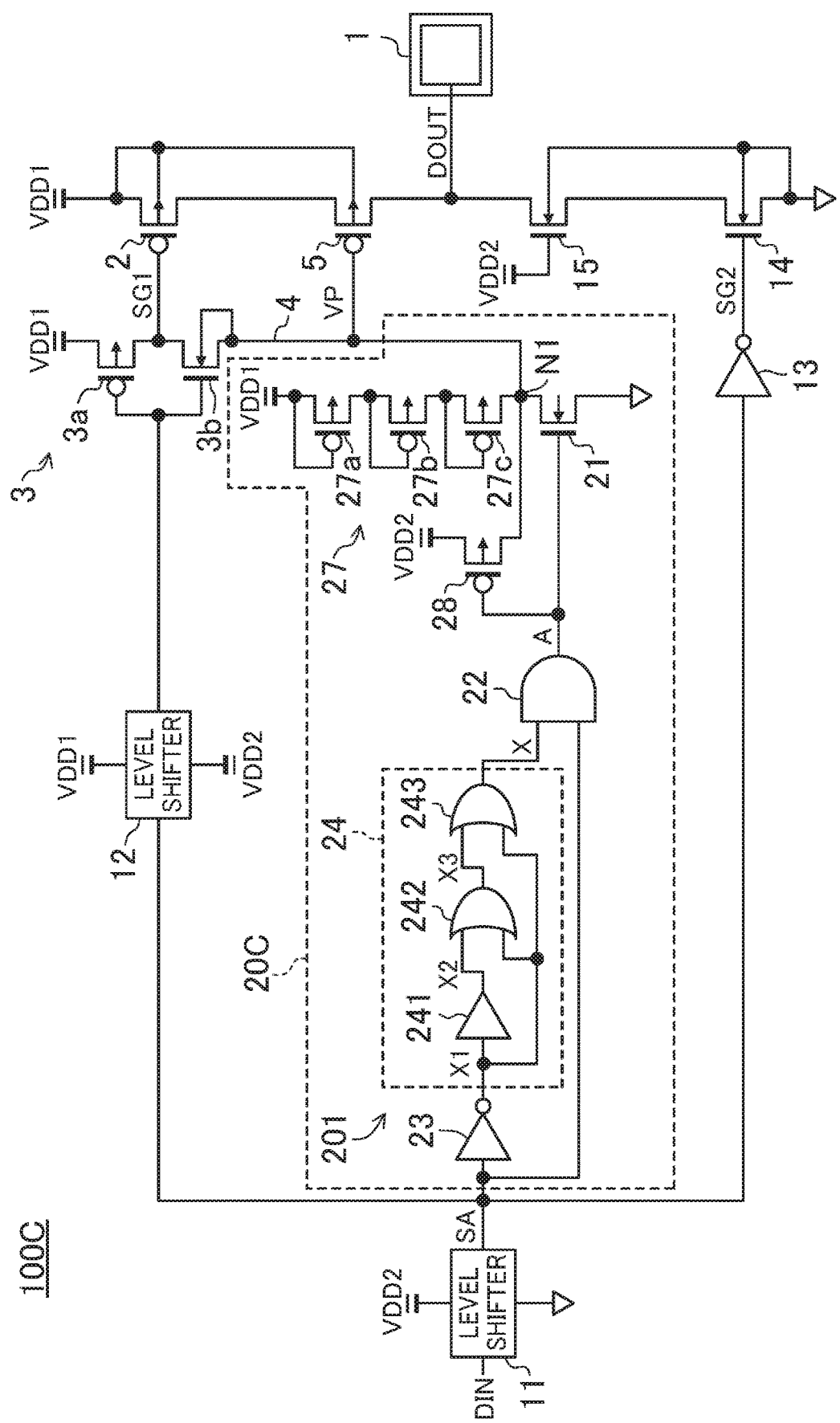
FIG. 9 is a circuit diagram of an output circuit according to a fourth embodiment.

FIG. 9 is a circuit diagram of an output circuit according to a fourth embodiment. An output circuit 100C in FIG. 9 has a configuration similar to that of the output circuit 100 in FIG. 1. Detailed explanations of the previously described features may be omitted.

The output circuit 100C in FIG. 9 is different in internal configuration of the drive assist circuit 20C from the output circuit 100 in FIG. 1. Similar to the drive assist circuit 20 in FIG. 1, the drive assist circuit 20C includes: the n-type transistor 21 having the source grounded; the AND gate 22; the inverter 23 receiving the signal SA; and the delay circuit 24 receiving an output signal from the inverter 23. The AND gate 22 receives, as inputs, the signal SA and an output from the delay circuit 24, and provides an output A to the gate of the n-type transistor 21. The drain of the n-type transistor 21 acts as the output node N1. The drive assist circuit 20C further includes: a diode string 27 having p-type diode-connected transistors 27a, 27b, 27c; and a p-type transistor 28. The diode string 27 has one end connected to the first power source VDD1, and another end connected to the output node N1. The p-type transistor 28 is provided between the second power source VDD2 and the output node N1, and has a gate supplied with the output A from the AND gate 22.

When the data input signal DIN is at the low level, the signal SA is at the low level. Here, in the drive assist circuit 20C, the output A is left at the low level. Thus, the n-type transistor 21 is in the non-conductive state, and the p-type transistor 28 is in the conductive state. Hence, the potential VP at the output node N1 is maintained at the second potential VDD2.

When the data input signal DIN transits to the high level and the signal SA transits to the high level, the output A in the drive assist circuit 20C stays at the high level for a predetermined time period. This is as already described in the first embodiment. When the output A is at the high level, the n-type transistor 21 is in the conductive state and the p-type transistor 28 is in the non-conductive state. In this case, the potential VP at the output node N1 is a potential obtained by subtracting a potential corresponding to a sum of threshold voltages of the p-type transistors 27a, 27b, 27c from the first potential VDD1.

Here, for example, when the first potential VDD1 supplied from an external power source drops, accordingly, the potential VP at the output node N1 drops further. Moreover, when the second potential VDD2 supplied from the external power source rises, the gate potential of the n-type transistor 21 rises. Hence, the potential VP at the output node N1 drops further. Specifically, along with the drop of the first potential VDD1 and the rise of the second potential VDD2, the potential VP at the output node N1 drops further. Hence, the gate-source voltage of the p-type transistor 2 rises further. Thus, even when the first potential VDD1 drops and the second potential VDD2 rises, such a feature can curb a decrease in driving capability of the p-type transistor 2.

Moreover, this embodiment can address variations in a manufacturing process. Specifically, when threshold voltages of the transistors are high because of the manufacturing process, and thus the transistors are slow in operation speed, the sum of the threshold voltages of the p-type transistors 27a, 27b, 27c becomes larger such that the potential VP of the output node N1 becomes lower. Meanwhile, when threshold voltages of the transistors are low because of the manufacturing process, and thus the transistors are fast in operation speed, the sum of the threshold voltages of the p-type transistors 27a. 27b, 27c becomes smaller such that the potential VP of the output node N1 does not become very low. Specifically, the slower the operation speeds of the transistors are, the higher the gate-source voltage of the p-type transistor 2 is. Hence, a decrease in the driving capability of the p-type transistor 2 can be appropriately curbed, depending on the manufacturing process.

Note that, in the configuration in FIG. 9, the diode string 27 includes, but not limited to, three p-type transistors 27a, 27b, 27c. Alternatively, the diode string 27 may include one or more p-type diode-connected transistors connected in series.

Figure 10:
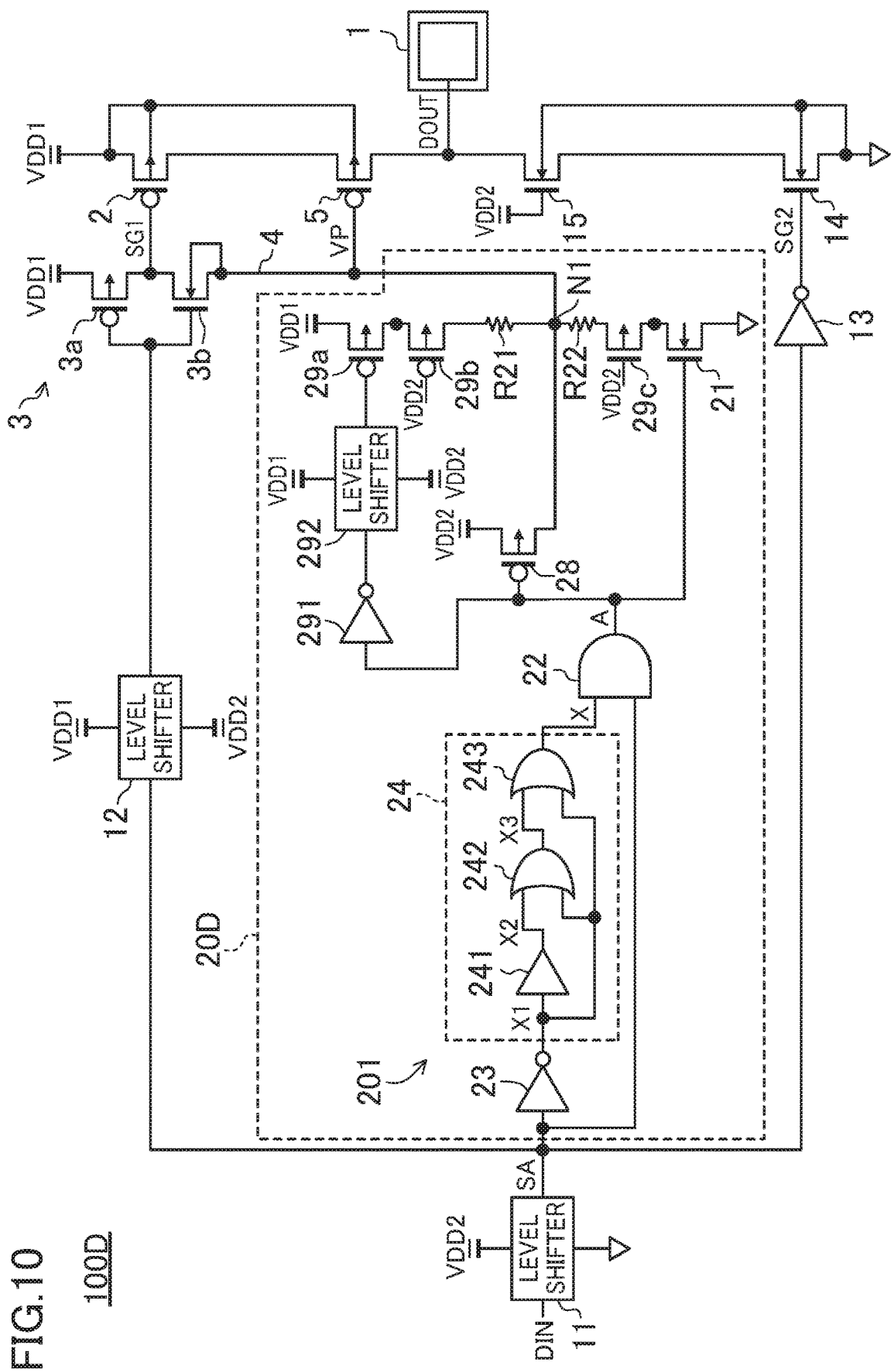
FIG. 10 is a circuit diagram in another example of the output circuit according to the fourth embodiment.

FIG. 10 is a circuit diagram in another example of the output circuit according to the fourth embodiment. In the output circuit 100D in FIG. 10, similar to the drive assist circuit 20C in FIG. 9, the drive assist circuit 20D is configured so that the potential VP at the output node N1 in the assist operation drops along with the drop of the first potential VDD1. Specifically, similar to the drive assist circuit 20C in FIG. 7, the drive assist circuit 20D includes: the n-type transistor 21 having the source grounded; the AND gate 22; the inverter 23 receiving the signal SA; the delay circuit 24 receiving an output signal from the inverter 23; and the p-type transistor 28 provided between the second power source VDD2 and the output node N1. The AND gate 22 receives, as inputs, the signal SA and an output from the delay circuit 24, and provides an output A to the gates of the n-type transistor 21 and the p-type transistor 28. The drive assist circuit 20D further includes: an inverter 291 receiving the output A from the AND gate 22; a level shifter 292 receiving an output from the inverter 291; p-type transistors 29a and 29b; an n-type transistor 29c; and resistors R21 and R22 connected in series. The p-type transistors 29a and 29b, the resistors R21 and R22, and the n-type transistors 29c and 21 are connected in the stated order between the first power source VDD1 and a grounded power source. A connection node between the resistors R21 and R22 acts as the output node N1 of the drive assist circuit 20D. The p-type transistor 29a has a gate provided with an output from the level shifter 292. Each of the p-type transistor 29b and the n-type transistor 29c has a gate provided with the second potential VDD2.

When the data input signal DIN is at the low level, the signal SA is at the low level. Here, in the drive assist circuit 20D, the output A is left at the low level. Hence, both the p-type transistor 29a and the n-type transistor 21 are in the non-conductive state. Hence, the potential VP at the output node N1 is maintained at the second potential VDD2.

When the data input signal DIN transits to the high level and the signal SA transits to the high level, the output A in the drive assist circuit 20D stays at the high level for a predetermined time period. This is as already described in the first embodiment. When the output A is at the high level, the p-type transistor 29a and the n-type transistor 21 are in the conductive state, and the p-type transistor 28 is in the non-conductive state. Hence, the potential VP at the output node N1 is the first potential VDD1 divided by the resistors R21 and R22.

Here, when the first potential VDD1 supplied from an external power source drops, accordingly, the potential VP at the output node N1 drops further. Specifically, along with the drop of the first potential VDD1, the potential VP at the output node N1 drops further. Hence, the gate-source voltage of the p-type transistor 2 rises further. Thus, even when the first potential VDD1 drops, a decrease in driving capability of the p-type transistor 2 can be curbed.

Moreover, since the drive assist circuits 20B and 20D each includes the delay circuit 24 having the configuration similar to that in the first embodiment, the assist operation can be reliably performed at the rising timing of the assist signal SA, even when the frequency of the data input signal DIN increases and the output circuit operates at a high speed.

Moreover, in the configuration of this embodiment, the potential VP at the output node N1 may be brought down through two paths as described in the second embodiment. Furthermore, in the configuration of this embodiment, the variation of the output signal DOUT may be provided as feedback, as disclosed in the third embodiment.

OTHER EMBODIMENTS

In the embodiments, the p-type transistor 2 driving the output signal DOUT is connected in a cascade to the output terminal 1 via the p-type transistor 5 in view of preventing a voltage of the p-type transistor 2 from exceeding a breakdown voltage. However, the present disclosure shall not be limited to this configuration.

Figure 11:
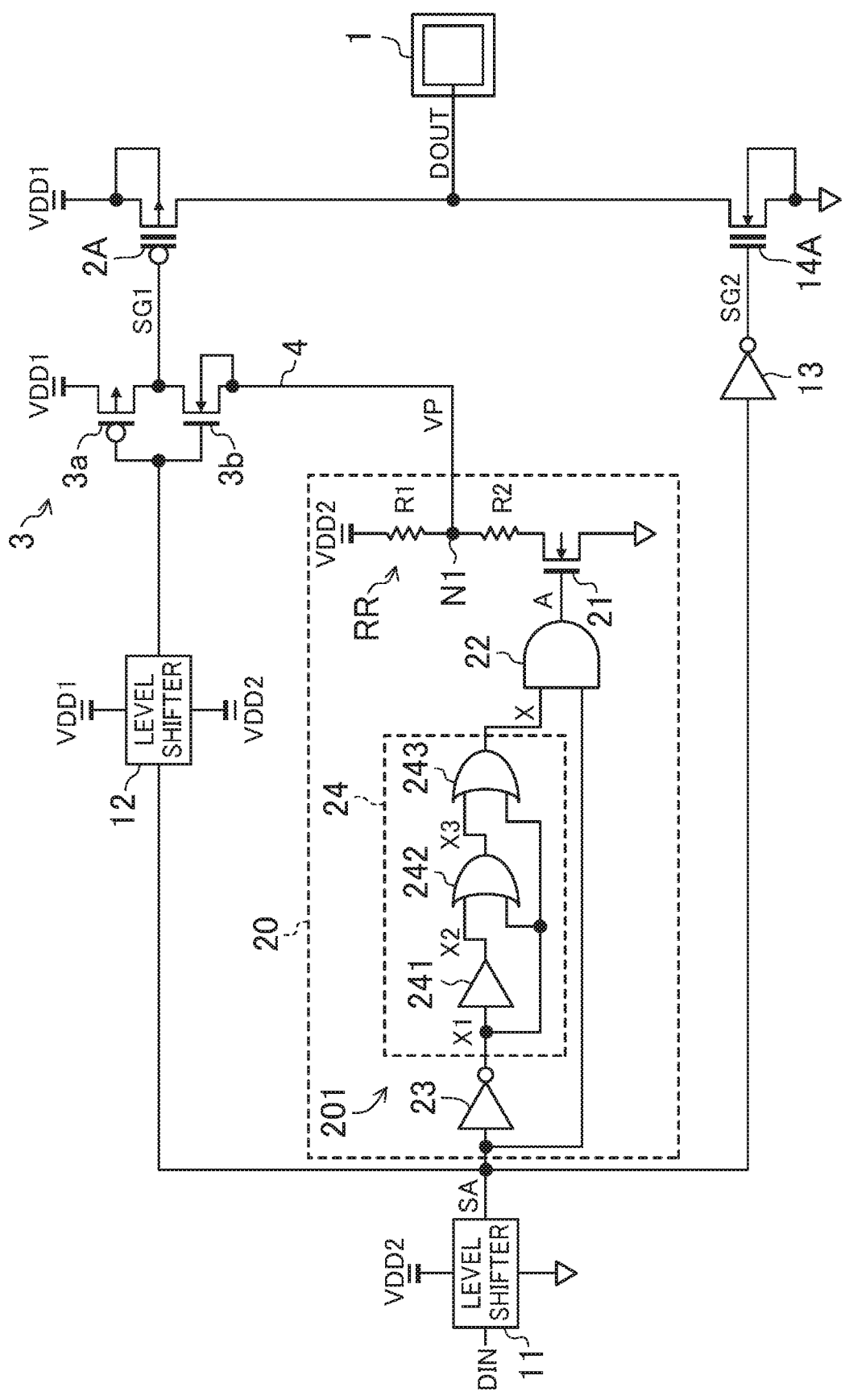
FIG. 11 is a circuit diagram of an output circuit according to another embodiment.

For example, an output circuit in FIG. 11 is similar in configuration to the output circuit 100 in FIG. 1, using a high-voltage device. In the configuration in FIG. 11, a p-type transistor 2A, acting as an output transistor driving the output signal DOUT, is directly connected to the output terminal 1. Moreover, an n-type transistor 14A driving the output signal DOUT is directly connected to the output terminal 1. Examples of the p-type transistor 2A and the n-type transistor 14A may include such a high-voltage device as a laterally diffused metal oxide semiconductor (LDMOS). The LDMOS has almost the same gate breakdown voltage and source breakdown voltage as, but a higher drain breakdown voltage than, a regular MOS has. The configuration in FIG. 11 with such a high-voltage device as the LDMOS makes it possible to implement an output circuit having a small area.

The configuration in FIG. 11 may be applied to the second to fourth embodiments. Note that, when the configuration is applied to the third embodiment, for example, the variation of the output signal DOUT may be monitored at a circuit receiving the output signal DOUT in the LSI.

Moreover, in the embodiments, the drive assist circuits 20, 20A, 20B, 20C, and 20D may receive, as an assist signal, the signal SA output from the level shifter 11. The assist signal received by the drive assist circuits may van in accordance with the data input signal DIN. Alternatively, the assist signal may be the data input signal DIN itself.

Furthermore, in each of the embodiments, logical levels of the assist signal SA and the gate signal SG1 are inverted; however, the logical levels may be the same. In this case, the drive assist circuits may perform the assist operation when the assist signal transits from the high level to the low level. Specifically, the drive assist circuits may perform the assist operation when the assist signal transits in response to the transition of the gate signal from the high level to the low level; that is, when the p-type transistors driving an output signal switch from the non-conductive state to the conductive state.

<Another Configuration Example of Pulse Generation Circuit>

In the above-described embodiment, the pulse generation circuit in the drive assist circuit includes an AND gate, and an inverter and a delay circuit provided on one of the input lines of the AND gate. However, the configuration of the pulse generation circuit in the drive assist circuit is not limited to this configuration.

Figure 12A:
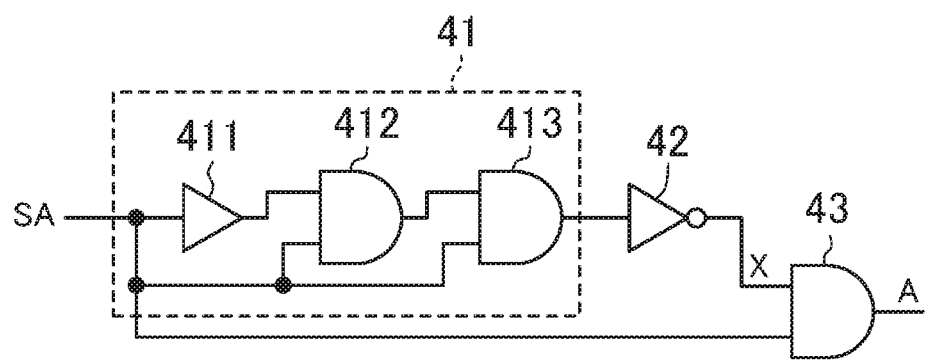
FIGS. 12A and 12B illustrate another exemplary configuration of a pulse generation circuit in a drive assist circuit according to the embodiment.

FIG. 12 is a circuit diagram illustrating another exemplary configuration of the pulse generation circuit. The pulse generation circuit of FIG. 12A includes a delay circuit 41, an inverter 42, and an AND gate 43. The delay circuit 41 receives the signal SA as an input. The inverter 42 receives an output from the delay circuit 41. The AND gate 43 receives an output from the inverter 42 and the signal SA. That is, compared with the circuit configuration of FIG. 4A, the delay circuit 41 and the inverter 42 are positioned other way around, and the polarity of the input (signal SA) to the delay circuit 41 is inverted from that in the circuit configuration of FIG. 4A. Therefore, the delay circuit 41 includes a buffer 411, and AND gates 412 and 413. The delay circuit 41 is configured such that a transmission delay of the rise of the signal SA is greater than the transmission delay of the fall of the signal SA.

Figure 12B:
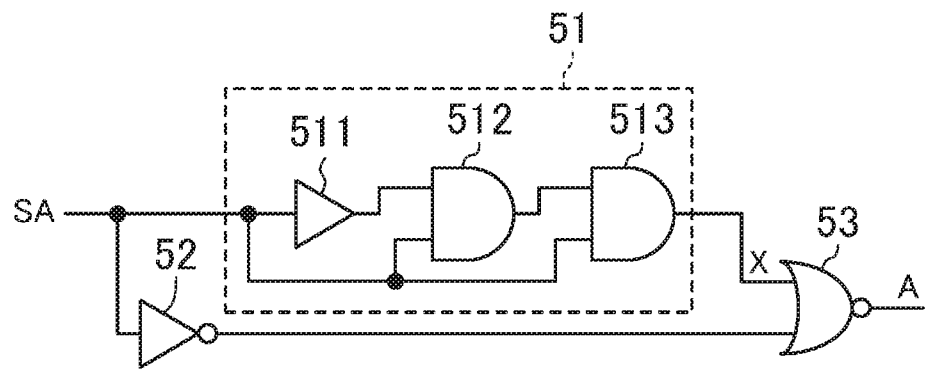

The pulse generation circuit of FIG. 12B includes a delay circuit 51, an inverter 52, and a NOR gate 53. The delay circuit 51 receives the signal SA as an input. The inverter 52 also receives the signal SA as an input. The NOR gate 53, on the other hand, receives an output from the delaying circuit 51 and an output from the inverter 52. That is, compared with the circuit configuration of FIG. 4A, the delay circuit 51 and the inverter 52 are arranged in another signal path, and the polarity of the input (signal SA) to the delay circuit 51 is inverted from that in the circuit configuration of FIG. 4A. Therefore, the delay circuit 51 includes a buffer 511, and AND gates 512 and 513. The delay circuit 51 is configured such that a transmission delay of the rise of the signal SA is greater than the transmission delay of the fall of the signal SA. Moreover, the AND gate is replaced with the NOR gate 53, because the polarities of the two inputs to the gate at the last stage are also inverted from that of the circuit configuration illustrated in FIG. 4A.

That is, a pulse generation circuit of the present disclosure includes a logic gate having at least two inputs and configured to output a pulse, a delay circuit provided to one of two paths configured to transmit an assist signal to the two inputs of the logic gate, respectively, and an inverter provided to one of the two paths. The delay circuit may be configured such that a delay is greater when an input to the delay circuit makes a transition corresponding to the first transition of the assist signal, as compared to a delay when an input to the delay circuit makes a transition corresponding to an inverse of the first transition of the assist signal.

Note that the present disclosure is not limited to the configurations disclosed in the above embodiments. The present disclosure may be modified in multiple ways within technical ideas of the present disclosure by those skilled in the art. Furthermore, the constituent elements in embodiments may be combined in any given manner within the scope of the present disclosure.

For example, the present disclosure is capable of providing an output circuit that can avoid malfunction even when the speed of the circuit operation is increased, and therefore is effective for raising the speed or improving the performance of the LSI.

What is claimed is:

1. An output circuit configured to receive a data input signal, and output an output signal that varies in accordance with the data input signal, the output circuit comprising:
    an output terminal outputting the output signal;
    a p-type output transistor having a source connected to a first power source providing a first potential and a drain connected to the output terminal;
    a pre-driver connected to the first power source and a power source end supplied with a potential lower than the first potential, and configured to receive a signal varying in accordance with the data input signal and to provide a gate signal to a gate of the p-type output transistor, the gate signal transiting between the first potential and the potential supplied to the power source end in accordance with the signal received; and
    a drive assist circuit connected to a second power source providing a second potential lower than the first potential, and configured to supply the second potential from an output node to the power source end,
    the drive assist circuit
    being configured to receive, as an assist signal, the data input signal or a signal varying in accordance with the data input signal, and being configured to perform an assist operation of temporarily bringing down a potential at the output node from the second potential when the assist signal makes a first transition corresponding to the transition of the gate signal from a high level to a low level, and
    including a pulse generation circuit configured to receive the assist signal, and configured to output a pulse that controls the assist operation when the assist signal makes the first transition, the pulse generation circuit including
a logic gate having at least two inputs and configured to output the pulse,
a delay circuit provided to one of two paths configured to transmit the assist signal to the two inputs of the logic gate, respectively, and
an inverter provided to one of the two paths,
the delay circuit being configured such that a delay is greater when an input to the delay circuit makes a transition corresponding to the first transition of the assist signal, as compared to a delay when the input to the delay circuit makes a transition corresponding to an inverse of the first transition of the assist signal.

2. The output circuit of claim 1, wherein
the drive assist circuit includes:
a resistor string including resistors connected in series, and having a first end connected to the second power source, one of connection nodes between the resistors being the output node; and
a switching element provided between a second end of the resistor string and a grounded power source, and configured to receive an output from the pulse generation circuit, the switching element being (i) in a conductive state when the pulse generation circuit outputs the pulse and (ii) in a non-conductive state when the pulse generation circuit does not output the pulse.

3. The output circuit of claim 2, wherein
the drive assist circuit includes:
a second pulse generation circuit configured to receive the assist signal, and being configured to output a second pulse shorter in pulse width than the pulse output from the pulse generation circuit when the assist signal makes the first transition; and
a second switching element provided between the output node and the grounded power source, and configured to receive an output from the second pulse generation circuit, the second switching element being (i) in a conductive state when the second pulse generation circuit outputs the second pulse and (ii) in a non-conductive state when the second pulse generation circuit does not output the second pulse.

4. The output circuit of claim 1, further comprising
a monitor circuit monitoring a variation of the output signal, and outputting a monitor signal varying in accordance with the output signal, wherein
the drive assist circuit is configured to receive the monitor signal, and is configured to suspend the assist operation when a variation occurs in the monitor signal which indicates a transition of the output signal from a low level to a high level after the assist signal makes the first transition to cause the drive assist circuit to start the assist operation.

5. The output circuit of claim 1, wherein
the drive assist circuit is configured such that the potential at the output node in the assist operation drops along with a drop of the first potential.

6. The output circuit of claim 5, wherein
the pulse generation circuit is configured to output a pulse that is brought up to a high level when the assist signal makes the first transition, and
the drive assist circuit includes:
a diode string including one p-type diode-connected transistor or a plurality of p-type diode-connected transistors connected in series, and having a first end connected to the first power source and a second end acting as the output node;
a p-type transistor provided between the second power source and the output node, and having a gate supplied with an output from the pulse generation circuit; and
an n-type transistor provided between the output node and a grounded power source, and having a gate supplied with the output from the pulse generation circuit.

7. The output circuit of claim 1, wherein
the drain of the p-type output transistor is connected in a cascade to the output terminal via another transistor.

8. The output circuit of claim 1, wherein
the drain of the p-type output transistor is directly connected to the output terminal.

9. The output circuit of claim 8, wherein
the p-type output transistor is a laterally diffused metal oxide semiconductor (LDMOS).

* * * * *